(12) United States Patent
Tsai et al.

(10) Patent No.: US 8,339,793 B2
(45) Date of Patent: Dec. 25, 2012

(54) ELECTRONIC DEVICE WITH A MOTHERBOARD WATERPROOFING MECHANISM

(75) Inventors: Yu-Han Tsai, Taipei Hsien (TW); Chun-Wang Lin, Taipei Hsien (TW); Yu-Hsien Huang, Taipei Hsien (TW); Chi-Jen Lo, Taipei Hsien (TW); Feng-Hsiung Wu, Taipei Hsien (TW)

(73) Assignee: Wistron Corporation (TW)

( * ) Notice: Subject to any disclaimer, the term of this patent is extended or adjusted under 35 U.S.C. 154(b) by 310 days.

(21) Appl. No.: 12/578,698

(22) Filed: Oct. 14, 2009

(65) Prior Publication Data

US 2010/0328906 A1    Dec. 30, 2010

(30) Foreign Application Priority Data

Jun. 24, 2009 (TW) .............................. 98211357 U

(51) Int. Cl.
*H05K 5/00* (2006.01)
*H05K 7/00* (2006.01)
*H05K 7/14* (2006.01)

(52) U.S. Cl. ........ 361/752; 361/728; 361/730; 361/748; 361/796

(58) Field of Classification Search .................. 361/728, 361/730, 752, 796, 679.01, 748
See application file for complete search history.

(56) References Cited

U.S. PATENT DOCUMENTS

| | | | | |
|---|---|---|---|---|
| 2006/0279942 | A1* | 12/2006 | Yasuda | 361/796 |
| 2007/0109730 | A1* | 5/2007 | Shigyo et al. | 361/600 |
| 2007/0134981 | A1* | 6/2007 | Shinoda et al. | 439/587 |
| 2009/0253027 | A1* | 10/2009 | Yang et al. | 429/61 |

* cited by examiner

*Primary Examiner* — Timothy Thompson
*Assistant Examiner* — Sherman Ng
(74) *Attorney, Agent, or Firm* — Ostrolenk Faber LLP

(57) ABSTRACT

An electronic device includes: first and second housing bodies cooperating to form an inner receiving space; a motherboard disposed in the inner receiving space, partitioned by a partition line into a port zone having at least one input/output connector, and a non-port zone; first and second waterproof strips disposed respectively between the first housing body and the motherboard and between the second housing body and the motherboard, and disposed at the partition line, the second waterproof strip having opposite ends formed with respective extension parts extending perpendicularly toward the first waterproof strip and disposed at the peripheral edge of the motherboard; and a third waterproof strip connected to the first waterproof strip to form a closed seal ring therewith, disposed between the first and second housing bodies, and disposed at an outer side of a peripheral edge of the non-port zone.

11 Claims, 5 Drawing Sheets

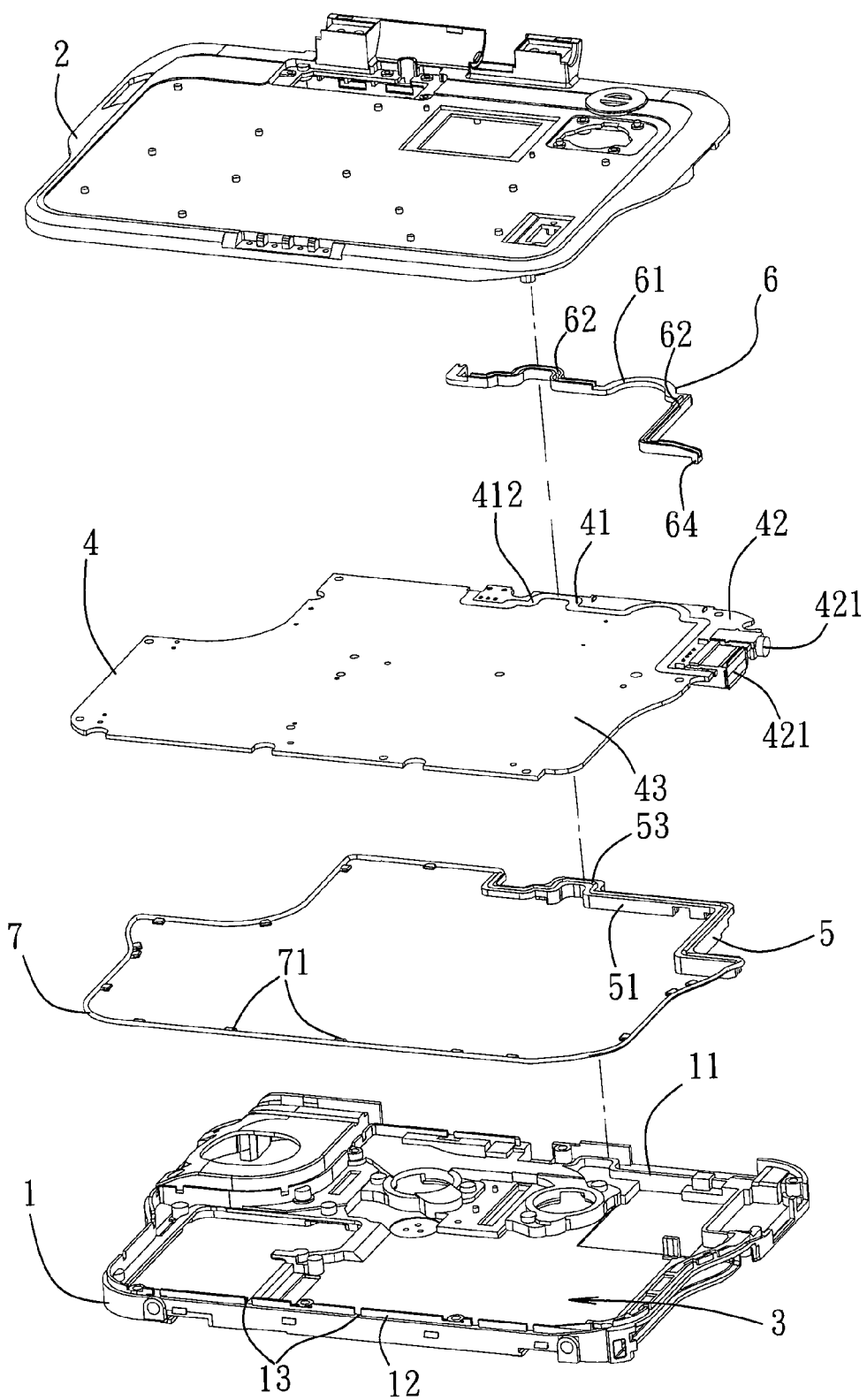
F I G. 2

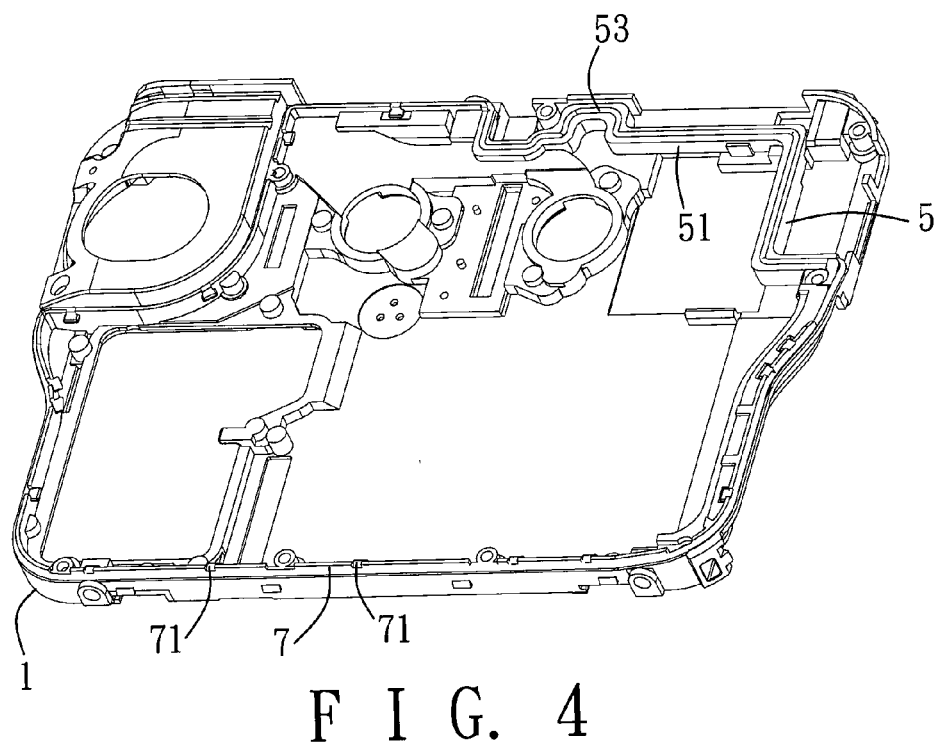
F I G. 4
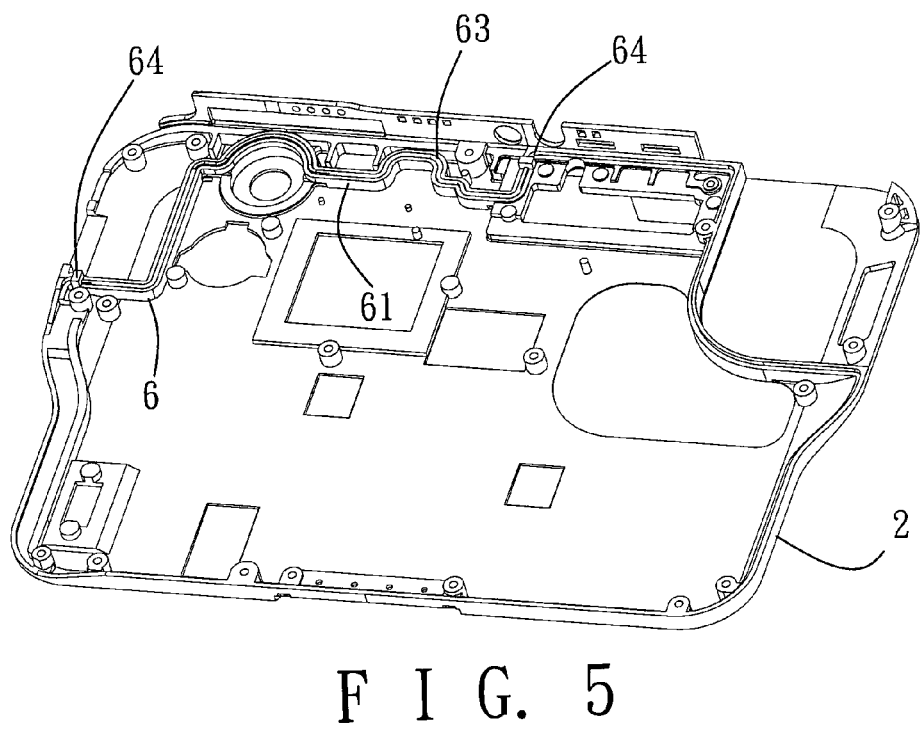
F I G. 5

ELECTRONIC DEVICE WITH A MOTHERBOARD WATERPROOFING MECHANISM

CROSS-REFERENCE TO RELATED APPLICATION

This application claims priority of Taiwanese Application No. 098211357, filed on Jun. 24, 2009.

BACKGROUND OF THE INVENTION

1. Field of the Invention

The present invention relates to an electronic device, more particularly to an electronic device with a motherboard waterproofing mechanism.

2. Description of the Related Art

Currently, there are two designs of motherboard waterproofing mechanisms that take into account the exposure of I/O ports. One design has waterproofing gates disposed in front of I/O ports, has a motherboard disposed between an upper housing and a lower housing, and has a rubber waterproof strip disposed at the connection between the upper housing and the lower housing. On the other hand, the other design has I/O ports connected to an extension board that is separated from a motherboard and that is connected to the motherboard via cables, has the motherboard disposed between the upper housing and the lower housing, and has a rubber waterproof strip disposed at the connection between the upper housing and the lower housing.

However, both designs require larger numbers of components and incur higher production costs.

SUMMARY OF THE INVENTION

Therefore, an object of the present invention is to provide an electronic device with a motherboard waterproofing mechanism that is simple and cost-effective.

Accordingly, an electronic device with a motherboard waterproofing mechanism of the present invention comprises: a first housing body, a second housing body, a motherboard, a first waterproof strip, a second waterproof strip, and a third waterproof strip.

The second housing body is connected to the first housing body and cooperates with the first housing body to form an inner receiving space. The motherboard is disposed in the inner receiving space and is partitioned by a partition line into a port zone and a non-port zone. The port zone is provided with at least one input/output (I/O) connector. The partition line has opposite ends that terminate at a peripheral edge of the motherboard. The first waterproof strip is disposed between the first housing body and the motherboard and is disposed at the partition line. The second waterproof strip is disposed between the second housing body and the motherboard and is disposed at the partition line. The second waterproof strip has two ends respectively formed with an extension part that extends perpendicular to the motherboard, that is disposed at the peripheral edge of the motherboard, and that extends toward the first waterproof strip. The third waterproof strip is connected to the first waterproof strip and cooperates therewith to form a closed seal ring. The third waterproof strip is disposed between the first housing body and the second housing body and is disposed at an outer side of a peripheral edge of the non-port zone of the motherboard.

Preferably, the first housing body is provided with a first engaging unit at a position corresponding to the first waterproof strip. The first waterproof strip includes a strip body that has a surface facing the first housing body, and a second engaging unit disposed on at least a portion of the surface of the strip body. One of the first and second engaging units is a rib structure. The other one of the first and second engaging units is a groove structure to engage the rib structure.

Preferably, the strip body of the first waterproof strip further has another surface facing the motherboard. The first waterproof strip further includes a strip protrusion disposed on said another surface of the strip body of the first waterproof strip. The strip body of the first waterproof strip has first and second ends, and the strip protrusion protrudes toward the motherboard and extends from the first end of the strip body to the second end of the strip body.

Preferably, the second housing body is provided with a first engaging member at a position corresponding to the second waterproof strip. The second waterproof strip further includes a strip part and a second engaging member. The strip part is connected to and disposed between the extension parts of the second waterproof strip, and has a surface facing the second housing body. The second engaging member is disposed on at least a portion of the surface of the strip part. One of the first engaging member and the second engaging member is a rib structure, while the other one of the first engaging member and the second engaging member is a groove structure to engage the rib structure of said one of the first engaging member and the second engaging member.

Preferably, the strip part of the second waterproof strip further has another surface facing the motherboard. The second waterproof strip further includes a strip projection disposed on said another surface of the strip part of the second waterproof strip. The strip part of the second waterproof strip has first and second ends. The strip projection protrudes toward the motherboard and extends from the first end of the strip part to the second end of the strip part.

Preferably, each of the first waterproof strip, the second waterproof strip, and the third waterproof strip is made of a conductive polymeric material. The motherboard has a first motherboard face that faces the first waterproof strip and that is provided with a first conductive foil at the partition line to connect electrically with the first waterproof strip, and a second motherboard face that faces the second waterproof strip and that is provided with a second conductive foil at the partition line to connect electrically with the second waterproof strip.

Preferably, at least one of the first housing body and the second housing body is recessed at a connection with the other one of the first housing body and the second housing body such that the first housing body and the second housing body cooperate to form a strip groove at the connection between the first housing body and the second housing body. The third waterproof strip is received in the strip groove.

In the present invention, the first waterproof strip is disposed between the first housing body and the motherboard and is disposed at the partition line, and the second waterproof strip is disposed between the second housing body and the motherboard and is disposed at the partition line. The two extension parts of the second waterproof strip extend perpendicular to the motherboard, are disposed at the peripheral edge of the motherboard, and extend toward the first waterproof strip. In addition, the third waterproof strip is disposed between the first housing body and the second housing body and is disposed at the outer side of the peripheral edge of the non-port zone of the motherboard. The first, second, and third waterproof strips cooperate to form a simple and low-cost motherboard waterproofing mechanism for the motherboard.

BRIEF DESCRIPTION OF THE DRAWINGS

Other features and advantages of the present invention will become apparent in the following detailed description of the preferred embodiment with reference to the accompanying drawings, of which:

FIG. 2 is an exploded perspective view of the preferred embodiment viewed from the top;

FIG. 4 is a perspective view of the preferred embodiment illustrating the assembly relationships among a first waterproof strip, a third waterproof strip, and a first housing body;

FIG. 5 is a perspective view of the preferred embodiment illustrating the assembly relationship between a second waterproof strip and a second housing body;

DETAILED DESCRIPTION OF THE PREFERRED EMBODIMENT

Figure 1:
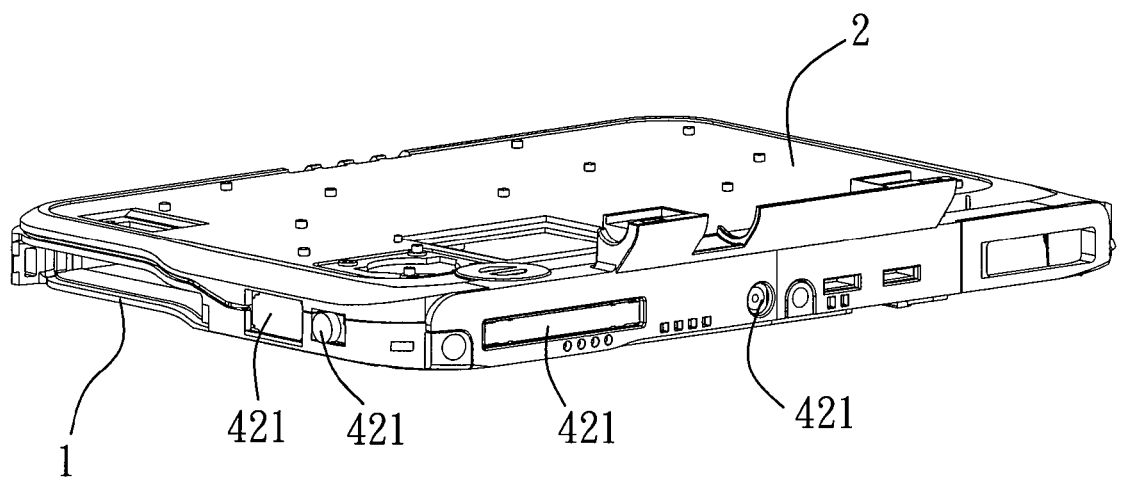
FIG. 1 is a perspective view of the preferred embodiment of an electronic device with a motherboard waterproofing mechanism according to the present invention.
Figure 3:
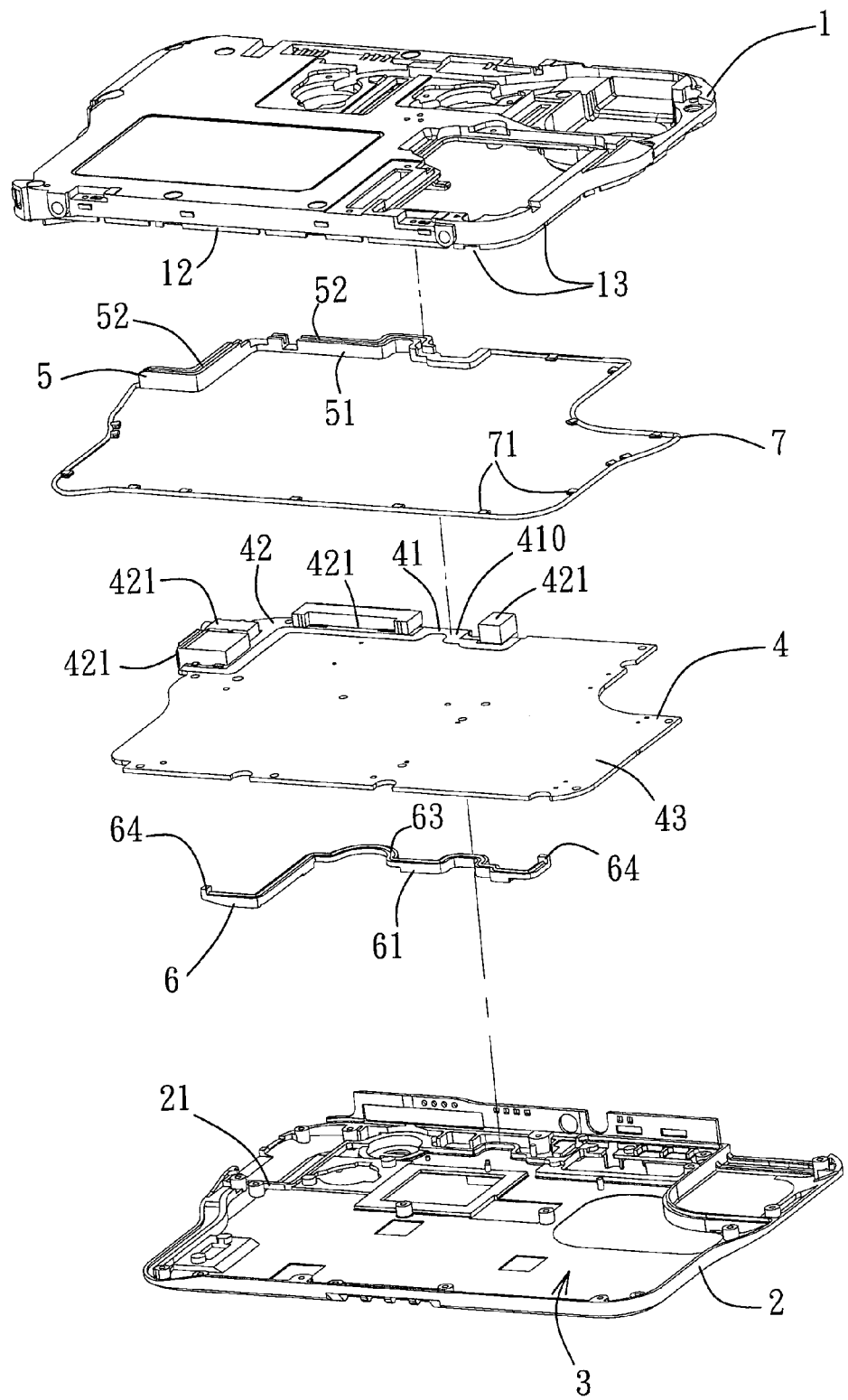
FIG. 3 is an exploded perspective view of the preferred embodiment viewed from the bottom.

Referring to FIGS. 1, 2, and 3, the preferred embodiment of an electronic device with a motherboard waterproofing mechanism according to the present invention is shown to include a first housing body 1, a second housing body 2, a motherboard 4, a first waterproof strip 5, a second waterproof strip 6, and a third waterproof strip 7.

The second housing body 2 is connected to the first housing body 1 and cooperates with the first housing body 1 to form an inner receiving space 3.

The motherboard 4 is disposed in the inner receiving space 3 and is partitioned by a partition line 41 into a port zone 42 and a non-port zone 43. The port zone 42 is provided with a plurality of input/output (I/O) connectors 421, while the non-port zone 43 is not provided with any I/O connector 421. The partition line 41 has opposite ends that terminate at a peripheral edge of the motherboard 4.

In the present embodiment, the port zone 42 has four I/O connectors 421, but port zone 42 in other embodiments may have at least one I/O connectors 421. The port zone 42 has dimensions and shape that are dependent on the number and locations of the I/O connectors 421. Hence, the partition line 41 is generally curved and bent at different segments.

Referring to FIGS. 2, 3, and 4, the first waterproof strip 5 and the third waterproof strip 7 are interconnected to form a closed seal ring. In the present embodiment, the first waterproof strip 5 and the third waterproof strip 7 are formed integrally.

The first waterproof strip 5 is disposed between the first housing body 1 and the motherboard 4 and is disposed at the partition line 41. The first waterproof strip 5 includes a strip body 51, second engaging unit 52, and a strip protrusion 53. The strip body 51 has first and second ends, a surface facing the first housing body 1, and another surface facing the motherboard 4. The second engaging unit 52 is disposed on at least a portion of the surface of the strip body 51 facing the first housing body 1. The second engaging unit 52 is a groove structure in this embodiment. The strip protrusion 53 is disposed on the surface of the strip body 51 facing the motherboard 4, protrudes toward the motherboard 4, and extends from the first end of the strip body 51 to the second end of the strip body 51.

The first housing body 1 is provided with a first engaging unit 11 at a position corresponding to the first waterproof strip 5. The second engaging unit 52 of the first waterproof strip 5 is secured to the first engaging unit 11 of the first housing body 1. The first engaging unit 11 is a rib structure to engage the groove structure of the second engaging unit 52 in this embodiment. Due to the first and second engaging units 11, 52, connection between the first waterproof strip 5 and the first housing body 1 can be conducted with relative ease, and replacement of the first waterproof strip 5 can be facilitated. On the other hand, as the first waterproof strip 5 is pressed against the motherboard 4, the strip protrusion 53 of the first waterproof strip 5 that protrudes toward the motherboard 4 enhances sealing between the first waterproof strip 5 and the motherboard 4, and hence is capable of improving the waterproofing effect.

The third waterproof strip 7 is disposed between the first housing body 1 and the second housing body 2 and is disposed at an outer side of a peripheral edge of the non-port zone 43 of the motherboard 4. At least one of the first housing body 1 and the second housing body 2 is recessed at a connection with the other one of the first housing body 1 and the second housing body 2 such that the first housing body 1 and the second housing body 2 cooperate to form a strip groove 12 at the connection between the first housing body 1 and the second housing body 2. The third waterproof strip 7 is received in the strip groove 12. In the present embodiment, the strip groove 12 is disposed at the first housing body 1. Moreover, the third waterproof strip 7 is provided with a plurality of projection sections 71 for securing to corresponding recess sections 13 of the first housing body 1.

Referring to FIGS. 2, 3, and 5, the second waterproof strip 6 is disposed between the second housing body 2 and the motherboard 4 and is disposed at the partition line 41. The second waterproof strip 6 includes a strip part 61, two extension parts 64, a second engaging member 62, and a strip projection 63. The strip part 61 has first and second ends, a surface facing the second housing body 2, and another surface facing the motherboard 4. The extension parts 64 are formed respectively at the first and second ends of the strip part 61, extend perpendicular to the motherboard 4, are disposed at the peripheral edge of the motherboard 4, and extend toward the first waterproof strip 5. The second engaging member 62 is disposed on at least a portion of the surface of the strip part 61 facing the second housing body 2. The second engaging member 62 is a groove structure in this embodiment. The strip projection 63 is disposed on the surface of the strip part 61 facing the motherboard 4, protrudes toward the motherboard 4, and extends from the first end of the strip part 61 to the second end of the strip part 61.

The second housing body 2 is provided with a first engaging member 21 at a position corresponding to the second waterproof strip 6. The second engaging member 62 of the second waterproof strip 6 is secured to the first engaging member 21 of the second housing body 2. The first engaging member 21 of the second housing body 2 is a rib structure to engage the groove structure of the second engaging member 62 of the second waterproof strip 6 in this embodiment. Due to the first and second engaging member 21, 62, connection between the second waterproof strip 6 and the second housing body 2 can be conducted with relative ease, and replacement of the second waterproof strip 6 can be facilitated. On the other hand, as the second waterproof strip 6 is pressed against the motherboard 4, the strip projection 63 of the second waterproof strip 6 that protrudes toward the motherboard 4 enhances sealing between the second waterproof strip 6 and the motherboard 4, and hence is capable of improving the waterproofing effect.

Figure 6:
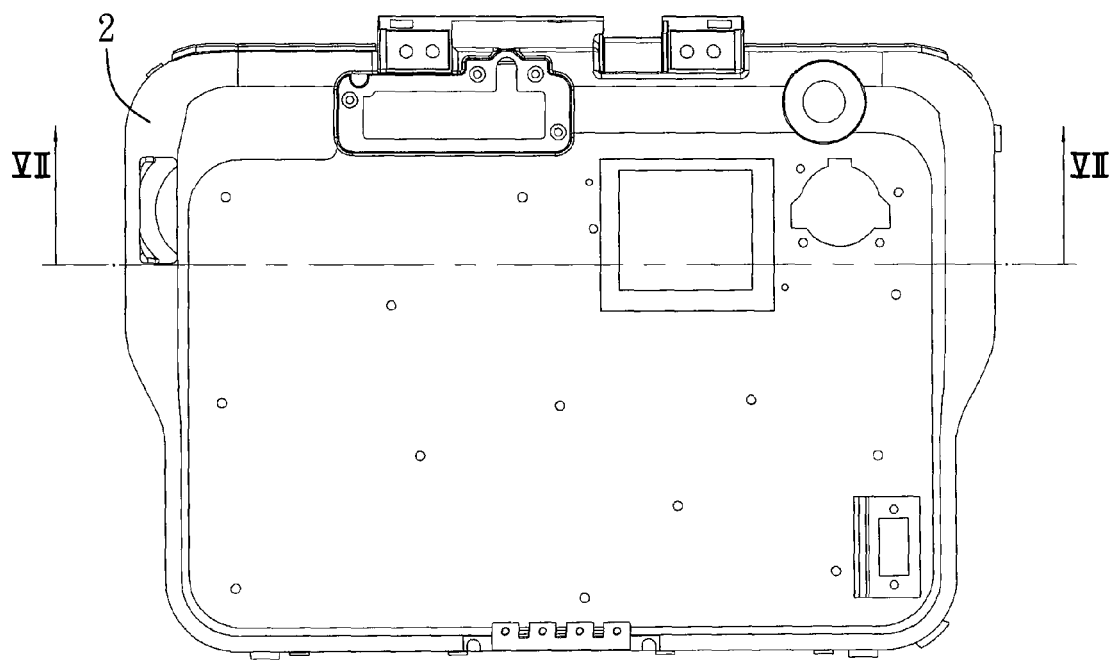
FIG. 6 is a schematic view of the preferred embodiment.
Figure 7:
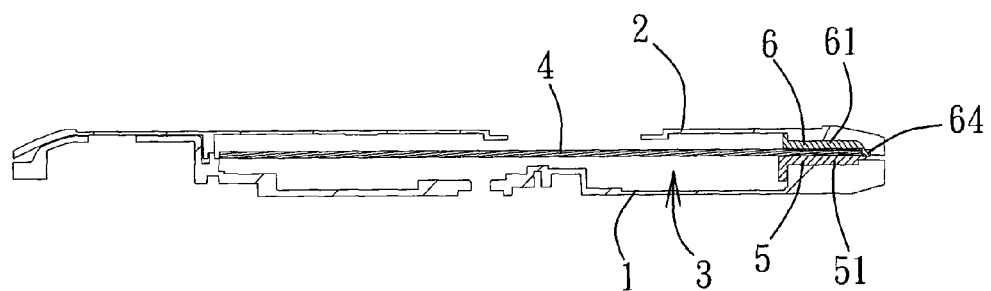
FIG. 7 is a sectional view of the preferred embodiment taken along line VII-VII in FIG. 6.

Referring to FIGS. 2, 6, and 7, the first waterproof strip 5 is disposed between the first housing body 1 and the motherboard 4, the second waterproof strip 6 is disposed between the second housing body 2 and the motherboard 4, and the third waterproof strip 7 is disposed between the first housing body 1 and the second housing body 2 and is disposed at the outer side of the peripheral edge of the non-port zone 43 of the motherboard 4.

Since the first waterproof strip 5 and the second waterproof strip 6 are disposed at the partition line 41 on opposite sides of the motherboard 4, respectively, and the two extension parts 64 of the second waterproof strip 6 are disposed at the peripheral edge of the motherboard 4 and extend respectively (as shown in FIG. 7) toward the first waterproof strip 5, the port zone 42 of the motherboard 4 can be isolated from the non-port zone 43 of the motherboard 4. In addition, the third waterproof strip 7 is disposed at the outer side of the peripheral edge of the non-port zone 43. Collectively, the first, second, and third waterproof strips 5,6,7 cooperate to form a motherboard waterproofing mechanism for the non-port zone 43 of the motherboard 4 such that the waterproofing effect of the non-port zone 43 is capable of reaching the IPX4 level.

In the present embodiment, the first, second, and third waterproof strips 5,6,7 are made of a conductive polymeric material, such as conductive rubber. The motherboard 4 has a first motherboard face that faces the first waterproof strip 5 and that is provided with a first conductive foil 410 (see FIG. 3) at the partition line 41 to connect electrically with the first waterproof strip 5, and a second motherboard face that faces the second waterproof strip 6 and that is provided with a second conductive foil 412 (see FIG. 2) at the partition line 41 to connect electrically with the second waterproof strip 6. Therefore, susceptibility to Electromagnetic Interference (EMI) can be reduced.

In the present invention, the first waterproof strip 5 is disposed between the first housing body 1 and the motherboard 4 and is disposed at the partition line 41, and the second waterproof strip 6 is disposed between the second housing body 2 and the motherboard 4 and is disposed at the partition line 41. The two extension parts 64 of the second waterproof strip 6 extend perpendicular to the motherboard 4, are disposed at the peripheral edge of the motherboard 4, and extend toward the first waterproof strip 5. In addition, the third waterproof strip 7 is disposed between the first housing body 1 and the second housing body 2 and is disposed at the outer side of the peripheral edge of the non-port zone 43 of the motherboard 4. The first, second, and third waterproof strips 5,6,7 cooperate to form a simple and low-cost motherboard waterproofing mechanism for waterproof the motherboard 4.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. An electronic device with a motherboard waterproofing mechanism, the device comprising:
    a first housing body comprising a side wall configured to define a plurality of recess sections;
    a second housing body connected to said first housing body, said second housing body positioned and configured to cooperate with said first housing body so as to form an inner receiving space;
    a motherboard positioned in said inner receiving space, said motherboard being partitioned by a partition line into a port zone and a non-port zone, said port zone including at least one input/output (I/O) connector, the partition line having opposite ends that terminate at a peripheral edge of said motherboard;
    a first waterproof strip positioned between said first housing body and said motherboard and positioned at the partition line;
    a second waterproof strip positioned between said second housing body and said motherboard and positioned at the partition line, said second waterproof strip having two ends, each end of the two ends comprising an extension part that extends perpendicular to said motherboard, each extension part positioned at said peripheral edge of said motherboard and extending toward said first waterproof strip; and
    a third waterproof strip connected to said first waterproof strip and cooperating therewith to form a closed seal ring, said third waterproof strip being positioned between said first housing body and said second housing body and being positioned at an outer side of a peripheral edge of said non-port zone of said motherboard, said third waterproof strip comprising a plurality of projection sections configured to secure to the plurality of recess sections of the first housing body,
    wherein said first waterproof strip, said second waterproof strip and said third waterproof strip cooperate to form a motherboard waterproofing mechanism for said motherboard.

2. The electronic device with a motherboard waterproofing mechanism as claimed in claim 1, wherein:
    said first housing body comprises a first engaging unit at a position corresponding to said first waterproof strip;
    said first waterproof strip including a strip body that has a surface facing said first housing body, and
    a second engaging unit positioned on at least a portion of said surface of said strip body;
    one of said first engaging unit and said second engaging unit being a rib structure;
    the other one of said first engaging unit and said second engaging unit being a groove structure configured to engage said rib structure.

3. The electronic device with a motherboard waterproofing mechanism as claimed in claim 2, wherein said strip body of said first waterproof strip further comprises another surface facing said motherboard, said first waterproof strip further including a strip protrusion positioned on said another surface of said strip body of said first waterproof strip, said strip body of said first waterproof strip having first and second ends, said strip protrusion protruding toward said motherboard and extending from said first end of said strip body to said second end of said strip body.

4. The electronic device with a motherboard waterproofing mechanism as claimed in claim 3, wherein:
    said second housing body comprises a first engaging member at a position corresponding to said second waterproof strip;
    said second waterproof strip including a strip part connected to and positioned between said extension parts, and the strip part comprises a surface facing said second housing body, and a second engaging member positioned on at least a portion of said surface of said strip part;

one of said first engaging member and said second engaging member being a rib structure;

the other one of said first engaging member and said second engaging member being a groove structure configured to engage said rib structure of said one of said first engaging member and said second engaging member.

5. The electronic device with a motherboard waterproofing mechanism as claimed in claim 4, wherein said strip part of said second waterproof strip further comprises another surface facing said motherboard, said second waterproof strip further including a strip projection positioned on said another surface of said strip part of said second waterproof strip, said strip part of said second waterproof strip having first and second ends, said strip projection protruding toward said motherboard and extending from said first end of said strip part to said second end of said strip part.

6. The electronic device with a motherboard waterproofing mechanism as claimed in claim 2, wherein:

said second housing body comprises a first engaging member at a position corresponding to said second waterproof strip;

said second waterproof strip including a strip part connected to and positioned between said extension parts, and the strip part comprises a surface facing said second housing body, and a second engaging member positioned on at least a portion of said surface of said strip part;

one of said first engaging member and said second engaging member being a rib structure;

the other one of said first engaging member and said second engaging member being a groove structure to engage said rib structure of said one of said first engaging member and said second engaging member.

7. The electronic device with a motherboard waterproofing mechanism as claimed in claim 6, wherein said strip part of said second waterproof strip further comprises another surface facing said motherboard, said second waterproof strip further including a strip projection positioned on said another surface of said strip part of said second waterproof strip, said strip part of said second waterproof strip having first and second ends, said strip projection protruding toward said motherboard and extending from said first end of said strip part to said second end of said strip part.

8. The electronic device with a motherboard waterproofing mechanism as claimed in claim 1, wherein:

said second housing body comprises a first engaging member at a position corresponding to said second waterproof strip;

said second waterproof strip including a strip part connected to and positioned between said extension parts, and the strip part comprises a surface facing said second housing body, and a second engaging member positioned on at least a portion of said surface of said strip part;

one of said first engaging member and said second engaging member being a rib structure;

the other one of said first engaging member and said second engaging member being a groove structure to engage said rib structure of said one of said first engaging member and said second engaging member.

9. The electronic device with a motherboard waterproofing mechanism as claimed in claim 8, wherein said strip part of said second waterproof strip further comprises another surface facing said motherboard, said second waterproof strip further including a strip projection positioned on said another surface of said strip part of said second waterproof strip, said strip part of said second waterproof strip having first and second ends, said strip projection protruding toward said motherboard and extending from said first end of said strip part to said second end of said strip part.

10. The electronic device with a motherboard waterproofing mechanism as claimed in claim 1, wherein:

each of said first waterproof strip, said second waterproof strip, and said third waterproof strip is made of a conductive polymeric material, and said motherboard has a first motherboard face that faces said first waterproof strip and that comprises a first conductive foil at the partition line configured to connect electrically with said first waterproof strip, and a second motherboard face that faces said second waterproof strip and that comprises a second conductive foil at the partition line configured to connect electrically with said second waterproof strip.

11. The electronic device with a motherboard waterproofing mechanism as claimed in claim 1, wherein at least one of said first housing body and said second housing body is recessed at a connection with the other one of said first housing body and said second housing body such that said first housing body and said second housing body cooperate to form a strip groove at said connection between said first housing body and said second housing body, said third waterproof strip being received in said strip groove.

* * * * *